(12) United States Patent
Murayama et al.

(10) Patent No.: US 9,716,053 B2
(45) Date of Patent: Jul. 25, 2017

(54) SEMICONDUCTOR DEVICE, HEAT CONDUCTOR, AND METHOD FOR MANUFACTURING SEMICONDUCTOR DEVICE

(71) Applicant: Shinko Electric Industries Co., LTD., Nagano-ken (JP)

(72) Inventors: Kei Murayama, Nagano-Ken (JP); Yoshihiro Ihara, Nagano-Ken (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 49 days.

(21) Appl. No.: 14/694,533

(22) Filed: Apr. 23, 2015

(65) Prior Publication Data

US 2015/0327397 A1    Nov. 12, 2015

(30) Foreign Application Priority Data

May 9, 2014 (JP) .................................. 2014-097485

(51) Int. Cl.
*H01L 23/373* (2006.01)
*H01L 23/433* (2006.01)
(Continued)

(52) U.S. Cl.
CPC ........ *H01L 23/373* (2013.01); *H01L 23/3675* (2013.01); *H01L 23/3735* (2013.01);
(Continued)

(58) Field of Classification Search
CPC . H01L 23/373; H01L 23/433; H01L 23/3675; H01L 23/3737; H01L 23/3735;
(Continued)

(56) References Cited

U.S. PATENT DOCUMENTS

| 8,130,500 B2* | 3/2012 | Oda ...................... H01L 23/373 165/185 |
| 2004/0150100 A1* | 8/2004 | Dubin .................... B82Y 10/00 257/720 |

(Continued)

FOREIGN PATENT DOCUMENTS

JP          2010-171200 A       8/2010

*Primary Examiner* — Adam B Dravininkas
(74) *Attorney, Agent, or Firm* — Wolf, Greenfield & Sacks, P.C.

(57) ABSTRACT

A semiconductor device includes a wiring substrate, a semiconductor element mounted on the wiring substrate, and a heat dissipation component arranged on the wiring substrate. The heat dissipation component includes a cavity that accommodates the semiconductor element and includes an inner surface opposing the wiring substrate. The semiconductor element is located between the inner surface of the cavity and the wiring substrate. A heat conductor is bonded to the semiconductor element and to the inner surface of the cavity. The heat conductor includes linear heat conductive matters arranged between the semiconductor element and the heat dissipation component. A first alloy layer bonded to the semiconductor element covers lower ends of the heat conductive matters. The heat dissipation component includes a through hole extending through the heat dissipation component toward the heat conductor from a location outside of the heat conductor in a plan view.

4 Claims, 6 Drawing Sheets

(51) Int. Cl.
*H01L 23/367* (2006.01)
*H05K 7/20* (2006.01)

(52) U.S. Cl.
CPC ........ *H01L 23/3737* (2013.01); *H01L 23/433* (2013.01); *H05K 7/2039* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/16151* (2013.01); *H01L 2924/16152* (2013.01); *H05K 2201/0323* (2013.01); *H05K 2201/066* (2013.01)

(58) Field of Classification Search
CPC . H01L 2224/73204; H01L 2224/32225; H01L 2224/16225; H01L 2924/16151; H01L 2224/73253; H01L 2924/15311; H01L 2924/16152; H05K 7/2039; H05K 2201/066; H05K 2201/0323
USPC ................. 361/702–704, 709–712, 714–719
See application file for complete search history.

(56) References Cited

U.S. PATENT DOCUMENTS

| | | | | |
|---|---|---|---|---|
| 2004/0261987 | A1* | 12/2004 | Zhang | B82Y 10/00 165/183 |
| 2006/0234056 | A1* | 10/2006 | Huang | H01L 23/373 428/408 |
| 2009/0008779 | A1* | 1/2009 | Suhir | B82Y 10/00 257/751 |
| 2010/0299918 | A1* | 12/2010 | Oda | H01L 23/3675 29/841 |
| 2010/0327431 | A1* | 12/2010 | Touzelbaev | B23K 1/0016 257/712 |
| 2011/0032678 | A1* | 2/2011 | Altman | H01L 23/373 361/709 |
| 2011/0083836 | A1* | 4/2011 | Kobayashi | H01L 23/373 165/185 |
| 2011/0090650 | A1* | 4/2011 | Oda | H01L 23/373 361/717 |
| 2011/0149537 | A1* | 6/2011 | Kurosawa | H01L 23/3675 361/760 |
| 2013/0188319 | A1* | 7/2013 | Yamaguchi | H05K 7/2039 361/717 |

* cited by examiner

SEMICONDUCTOR DEVICE, HEAT CONDUCTOR, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2014-097485, filed on May 9, 2014, the entire contents of which are incorporated herein by reference.

BACKGROUND ART

The present disclosure relates to a semiconductor device, a heat conductor, and a method for manufacturing a semiconductor device.

A semiconductor element for a central processing unit (CPU), a graphics processing unit (GPU), or the like is electrically connected and fixed to a substrate in a semiconductor package. The semiconductor element becomes hot when activated. This adversely affects the performance of the semiconductor element. Thus, the temperature of the semiconductor element needs to be forcibly lowered.

Japanese Laid-Open Patent Publication No. 2010-171200 describes a heat dissipation component (e.g., metal heat dissipation plate) that is arranged on a semiconductor element to release the heat generated by the semiconductor element into the ambient air. The heat dissipation component forms a passage that releases the heat of the semiconductor element to the outside. Further, techniques have been studied to improve the heat dissipation performance (heat radiation) of the heat dissipation plate. For example, a sheet of a heat conductor may be arranged between the heat dissipation component and the semiconductor element to improve the heat dissipation performance of the heat dissipation component. The heat conductor includes carbon nanotubes that are molded from a resin and arranged in the direction in which heat is transferred.

The end surfaces of the carbon nanotubes, which are arranged in the heat conduction direction, are in point contact with the heat dissipation component or the semiconductor element. This produces a large contact resistance where the end surfaces of the carbon nanotubes contact the heat dissipation component or the semiconductor element. Thus, the carbon nanotubes arranged in the heat transfer direction may not be able to obtain the expected heat dissipation performance.

SUMMARY OF THE INVENTION

One aspect of the present disclosure is a semiconductor device including a wiring substrate, a semiconductor element mounted on an upper surface of the wiring substrate, and a heat dissipation component arranged on the upper surface of the wiring substrate. The heat dissipation component includes a cavity that accommodates the semiconductor element and includes an inner surface opposing the upper surface of the wiring substrate. The semiconductor element is located between the inner surface of the cavity and the upper surface of the wiring substrate. A heat conductor is bonded to an upper surface of the semiconductor element and to the inner surface of the cavity. The heat conductor includes linear heat conductive matters, which are arranged between the semiconductor element and the heat dissipation component, and a first alloy layer, which is bonded to the upper surface of the semiconductor element. The first alloy layer covers lower ends of the heat conductive matters. The heat dissipation component includes a through hole extending through the heat dissipation component toward the heat conductor from a location outside of the heat conductor in a plan view.

Another aspect of the present disclosure is a heat conductor including linear heat conductive matters, a first metal layer that covers upper ends of the heat conductive matters, and a second metal layer that covers lower ends of the heat conductive matters. The first metal layer has a structure including first metal films and second metal films that are alternately stacked. The first metal films are formed by a first metal element having a self-heating property, the second metal films are formed by a second metal element having a self-heating property, and the second metal element differs from the first metal element. The second metal layer has a structure including third metal films and fourth metal films that are alternately stacked. The third metal films are formed by a third metal element having a self-heating property. The fourth metal films are formed by a fourth metal element having a self-heating property. The fourth metal element differs from the third metal element.

BRIEF DESCRIPTION OF THE DRAWINGS

The disclosure, together with objects and advantages thereof, may best be understood by reference to the following description of the presently preferred embodiments together with the accompanying drawings in which.

DETAILED DESCRIPTION OF THE INVENTION

Figure 1A:
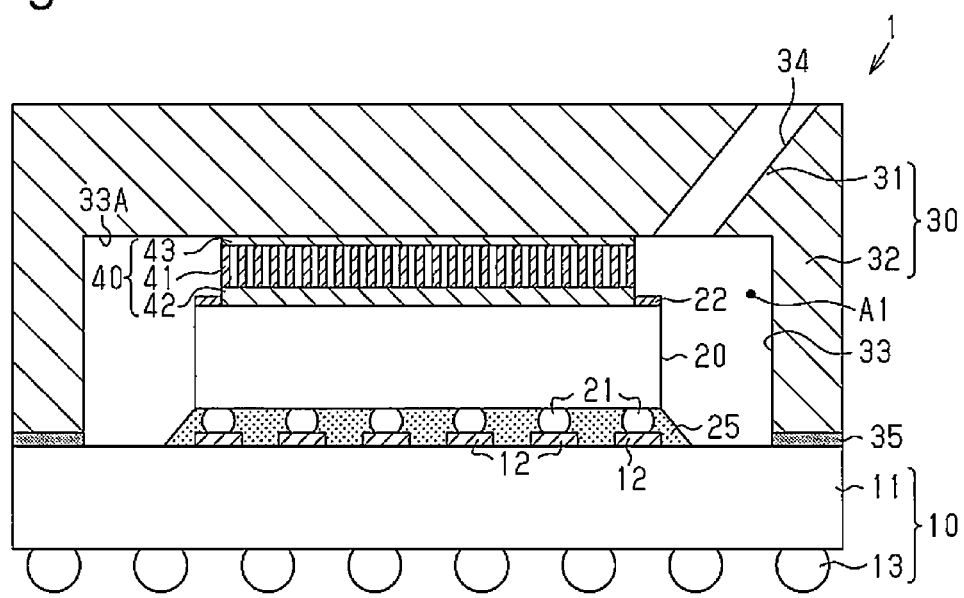
FIG. 1A is a schematic cross-section view of a semiconductor device in one embodiment.

In the drawings, elements are illustrated for simplicity and clarity and have not necessarily been drawn to scale. To facilitate understanding in the cross-sectional views, instead of using hatching lines, components may be shaded.

The structure of the semiconductor device 1 will now be described.

Referring to FIG. 1A, a semiconductor device 1 includes a ball grid array (BGA) wiring substrate 10, a semiconductor element 20 mounted on the upper surface of the wiring substrate 10, a heat dissipation plate 30 mounted on the upper surface of the wiring substrate 10, and a heat conductor 40 thermally coupling the semiconductor element 20 and the heat dissipation plate 30.

The wiring substrate 10 includes a substrate body 11, connection pads 12, and solder balls 13. The substrate body 11 only needs to have a structure in which the connection pads 12 and the solder balls 13 are electrically connected through the interior of the substrate body 11. Thus, wiring layers may be formed in the substrate body 11 but do not have to be formed in the substrate body 11. When wiring layers are formed in the substrate body 11, interlayer insulation layers are arranged between the stacked wiring layers. Further, vias extending through the wiring layers and the interlayer insulation layers electrically connect the connection pads 12 to the solder balls 13. The substrate body 11 may be, for example, a cored build-up substrate, which includes a core substrate, or a coreless substrate, which does not include a core substrate.

The connection pads 12 are formed on the upper surface of the substrate body 11. The material of the connection pads 12 may be, for example, copper (Cu) or a copper alloy.

The solder balls 13 are formed on the lower surface of the substrate body 11. The material of the solder balls 13 may be, for example, an alloy including lead (Pb), an alloy of tin (Sn) and Cu, an alloy of Sn and silver (Ag), or an alloy of Sn, Ag, and Cu. The solder balls 13 function as, for example, external connection terminals connected to a motherboard or the like.

The semiconductor element 20 is formed by covering an element formation surface (here, lower surface), on which a semiconductor integrated circuit (not illustrated) is formed, of a thin semiconductor substrate of silicon (Si) or the like with a passivation film, and arranging connection terminals 21 on the element formation surface. The semiconductor element 20 has a structure in which a metal film 22 is formed on a surface (here, upper surface) opposite to the element formation surface.

The semiconductor element 20 may be a logic chip such as a central processing unit (CPU) chip or a graphics processing unit (GPU) chip. Further, the semiconductor element 20 may be a memory chip such as a dynamic random access memory (DRAM) chip, a static random access memory (SRAM) chip, or a flash memory chip. The semiconductor element 20 has a size of, for example, approximately 10 mm×10 mm in a plan view. The semiconductor element 20 may have a thickness of, for example, 10 to 50 μm.

The semiconductor element 20 is, for example, flip-chip mounted on the wiring substrate 10. More specifically, the semiconductor element 20 is electrically connected by the connection terminals 21 to the connection pads 12 of the wiring substrate 10. The connection terminals 21 may be, for example, gold (Au) bumps or solder bumps. The material of the solder bumps may be, for example, an alloy including PB, an alloy of Sn and Cu, an alloy of Sn and Ag, or an alloy of An, Ag, and Cu. Further, the material of the metal film 22 may be, for example, Au or an Au alloy. The metal film 22 may have a thickness of, for example, approximately 0.01 to 0.5 μm.

An underfill resin 25 fills the gap between the lower surface of the semiconductor element 20 and the upper surface of the wiring substrate 10. The material of the underfill resin 25 may be, for example, an insulative resin such as an epoxy resin.

The heat dissipation plate 30 is arranged above the semiconductor element 20. The heat dissipation plate 30 is also referred to as a heat spreader. Preferably, the material of the heat dissipation plate 30 has satisfactory thermal conductivity. The material of the heat dissipation plate 30 may be Cu, Ag, aluminum (Al), or an alloy of these metals. In the present embodiment, Al is used. The material of the heat dissipation plate 30 does not have to be a metal as long as it has satisfactory thermal conductivity.

The heat dissipation plate 30 is mounted on the wiring substrate 10. The heat dissipation plate 30 is, for example, adhered by an adhesive 35 to a peripheral portion of the wiring substrate 10 surrounding the semiconductor element 20. The material of the adhesive 35 may be, for example, a silicon polymer resin.

The heat dissipation plate 30 includes a plate portion 31 and a side wall portion 32, which is frame-shaped and formed integrally with the periphery of the plate portion 31. The side wall portion 32 has a bottom surface bonded by the adhesive 35 to the wiring substrate 10. The plate portion 31 and the side wall portion 32 define a cavity 33 in the heat dissipation plate 30. The semiconductor element 20 is accommodated in an accommodation portion A1 defined by the cavity 33 and the wiring substrate 10. The heat dissipation plate 30 has a size of, for example, approximately 20 mm×20 mm to 50 mm×50 mm in a plan view. Further, the plate portion 31 of the heat dissipation plate 30 has a thickness of, for example, 0.5 to 4 mm.

The heat dissipation plate 30 includes a through hole 34 extending in, for example, the thicknesswise direction of the plate portion 31. More specifically, the plate portion 31 includes a through hole 34 extending from the upper surface of the plate portion 31 to the inner surface 33A of the cavity 33. The through hole 34 extends through the plate portion 31 from a location separated from the heat conductor 40 to a location proximal to the heat conductor 40. The through hole 34 extends through the plate portion 31 diagonally relative to the upper surface of the plate portion 31 from a location separated from the heat conductor 40 in a plan view toward the heat conductor 40. A plan view refers to a view of a subject (here, the plate portion 31) taken in a direction that is vertical (orthogonal) to the upper surface of the plate portion 31.

The heat conductor 40 is located between the upper surface of the semiconductor element 20 and the inner surface 33A of the cavity 33 in the heat dissipation plate 30. The upper surface of the semiconductor element 20 is thermally coupled to the inner surface 33A of the cavity 33 in the heat dissipation plate 30 by the heat conductor 40. Thus, the heat generated by the semiconductor element 20 is dissipated through the heat conductor 40 to the heat dissipation plate 30. For example, when the semiconductor element 20 is activated, the semiconductor element 20 generates heat at a temperature of approximately 100° C. to 110° C. The heat generated by the semiconductor element 20 is transferred to the heat dissipation plate 30 through the heat conductor 40 on the semiconductor element 20. In this manner, the heat conductor 40 functions as a means for thermally coupling the semiconductor element 20 and the heat dissipation plate 30 without direct contact between the semiconductor element 20 and the heat dissipation plate 30.

The structure of the heat conductor 40 will now be described.

Figure 1B:
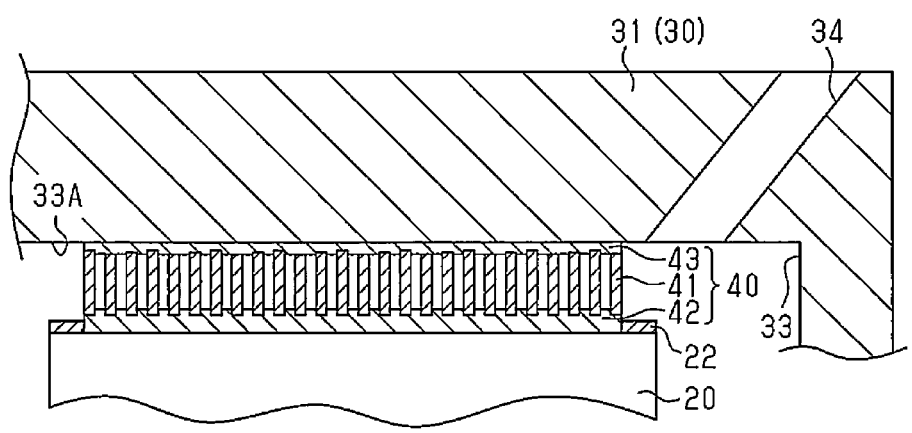
FIG. 1B is an enlarged cross-sectional view of a portion of the semiconductor device illustrated in FIG. 1A.

As illustrated in FIG. 1B, the heat conductor 40 includes carbon nanotubes 41, an alloy layer 42, and an alloy layer 43.

The carbon nanotubes 41 are formed between the alloy layer 42 and the alloy layer 43. The carbon nanotubes 41 are arranged, for example, on the upper surface of the alloy layer 42 in the direction heat is transferred (e.g., direction vertical to upper surface of semiconductor element 20). Each carbon nanotube 41 is, for example, a tubular (linear) carbon crystal having a diameter of approximately 0.7 to 300 nm. Further, the carbon nanotube 41 is formed from a heat conductive matter having high heat conductivity (e.g., 3000 W/m·K). The carbon nanotube 41 may be a single-layer carbon nanotube or a multilayer carbon nanotube. Instead of carbon nanotubes, the linear heat conductive matter may be, for example, fullerene or graphite. The carbon nanotube 41 may have a length of, for example, approximately 40 to 50 µm. There is a predetermined difference in the positions where the upper ends of the carbon nanotubes 41 are located. There is a difference of, for example, 2 µm between the position where the upper end of the shortest carbon nanotube 41 is located and the position where the upper end of the longest carbon nanotube 41 is located.

The alloy layer 42 is bonded to the carbon nanotubes 41 and the semiconductor element 20. The alloy layer 42 is formed to cover, for example, the lower ends of the carbon nanotubes 41. The alloy layer 42 integrally couples the carbon nanotubes 41 with one another in the lateral direction as viewed in FIG. 1 (planar direction that is substantially parallel to upper surface of semiconductor element 20). This increases the heat conductivity of the heat conductor 40 in the planar direction.

The alloy layer 42 is formed on, for example, the upper surface of the semiconductor element 20. The lower surface of the alloy layer 42 is in contact with the upper surface of the semiconductor element 20. The planar contact of the alloy layer 42 and the semiconductor element 20 allows for a decrease in the contact thermal resistance between the alloy layer 42 and the semiconductor element 20. Further, the alloy layer 42 is at least partially flush with a portion of the metal film 22. In the present example, the side surfaces of the alloy layer 42 are at least partially covered by the metal film 22. In other words, the metal film 22 is formed to partially cover the side surfaces of the alloy layer 42 and surround the alloy layer 42. The alloy layer 42 may have a thickness of, for example, 5 to 7 µm.

The material of the alloy layer 42 may be, for example, an alloy including aluminum (Al), palladium (Pd), and a metal element forming the metal film 22 (here, Au) or an alloy including Al, nickel (Ni), and a metal element forming the metal film 22 (here, Au). The melting point of the alloy layer 42 is higher than, for example, the melting point of lead-free solder (approximately 216° C. to 219° C.) and the melting point of indium (156° C.). For example, the melting point of the alloy layer 42 is approximately 800° C. to 1000° C.

The alloy layer 42 is, for example, a metal layer formed by alloying a metal element (here, Au) of the metal film 22. Thus, the alloy layer 42 is metallically integrated with the metal film 22, which is a portion of the semiconductor element 20. Thus, compared to when the alloy layer 42 and the semiconductor element 20 are only in physical contact, the contact thermal resistance may be decreased between the alloy layer 42 and the semiconductor element 20.

The alloy layer 43 is bonded to the carbon nanotubes 41 and the heat dissipation plate 30. The alloy layer 43 is formed to cover, for example, the upper ends of the carbon nanotubes 41. The alloy layer 43 integrally couples the carbon nanotubes 41 with one another in the lateral direction as viewed in FIG. 1 (planar direction that is substantially parallel to inner surface 33A of cavity 33). In this manner, by integrally coupling the carbon nanotubes 41 with one another in the planar direction, the heat conductivity of the heat conductor 40 is increased in the planar direction.

The alloy layer 43 is formed on, for example, the inner surface 33A of the cavity 33. The upper surface of the alloy layer 43 is in contact with the lower surface of the heat dissipation plate 30 (specifically, inner surface 33A of cavity 33). The planar contact of the alloy layer 43 and the heat dissipation plate 30 allows for a decrease in the contact thermal resistance between the alloy layer 43 and the heat dissipation plate 30. To absorb, for example, differences in the lengths of the carbon nanotubes 41, it is preferred that the alloy layer 43 have a greater thickness than the difference between the position where the upper end of the shortest carbon nanotube 41 is located and the position where the upper end of the longest carbon nanotube 41 is located. The alloy layer 43 may have a thickness of, for example, 2 to 5 µm.

The material of the alloy layer 43 may be, for example, an alloy including palladium (Pd) and a metal element forming the heat dissipation plate 30 (here, Al). The melting point of the alloy layer 43 is higher than, for example, the melting point of lead-free solder and the melting point of indium. For example, the melting point of the alloy layer 43 is approximately 800° C. to 1000° C.

The alloy layer 43 is, for example, a metal layer formed by alloying a metal element (here, Al) of the heat dissipation plate 30. Thus, the alloy layer 43 is metallically integrated with the heat dissipation plate 30. Thus, compared to when the alloy layer 43 and the heat dissipation plate 30 are only in physical contact, the contact thermal resistance may be decreased between the alloy layer 43 and the heat dissipation plate 30.

A method for manufacturing the semiconductor device 1 will now be described. A method for manufacturing the heat conductor 40 will first be described.

Figure 2A:
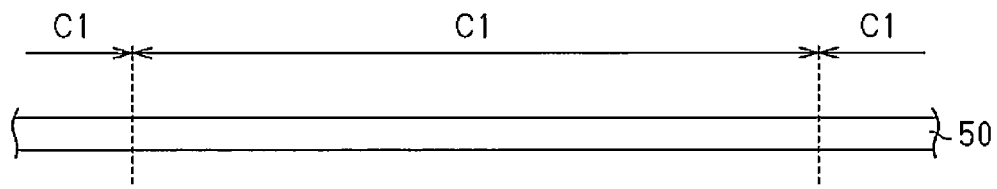
FIGS. 2A to 2C are schematic cross-sectional views illustrating the procedures for manufacturing a heat conductor in one embodiment.

In the step illustrated in FIG. 2A, a base material 50 is first prepared. The base material 50 is large enough to allow for the formation of a plurality of heat conductors 40. That is, the base material 50 includes a plurality of independent regions C1, each of which is used to form a heat conductor 40. The base material 50 may be formed from, for example, silicon or copper.

Figure 2B:
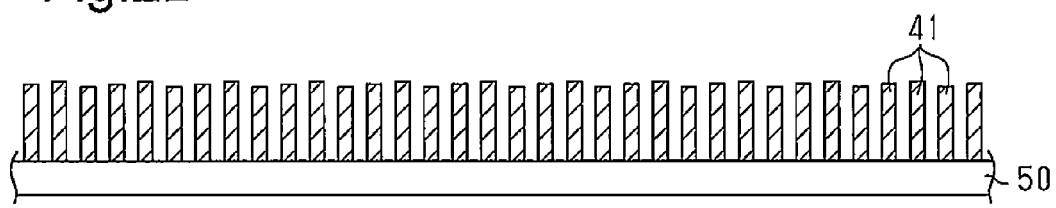

In the step illustrated in FIG. 2B, a large number of carbon nanotubes 41 are formed on the upper surface of the base material 50. For example, chemical vapor deposition (CVD) is performed to form the carbon nanotubes 41 on the upper surface of the base material 50.

In detail, sputtering or the like is first performed to form a metal catalyst layer (not illustrated) on the upper surface of the base material 50. The material of the metal catalyst layer may be, for example, iron (Fe), cobalt (Co), nickel (Ni), or the like. The metal catalyst layer may have a thickness of, for example, several nanometers.

Then, the base material 50, on which the metal catalyst layer is formed, is set in a heating furnace, which is set to a predetermined pressure and temperature, to undergo CVD that forms the carbon nanotubes 41 on the metal catalyst layer. The pressure and temperature of the heating furnace may be, for example, approximately 0.1 to 1.0 kPa and approximately 500° C. to 800° C. The process gas may be, for example, acetylene gas. The carrier gas may be, for example, argon gas or hydrogen gas.

The carbon nanotubes 41 are formed on the metal catalyst layer projecting in a direction orthogonal to the upper surface of the base material 50. The length from the upper surface of the base material 50 to the upper ends (distal ends) of the carbon nanotubes 41 may be controlled by the growth time of the carbon nanotubes 41. However, there is a predetermined difference in the lengths of the carbon nanotubes 41. The carbon nanotubes 41 may be formed by performing arc discharging, laser vaporization, or the like.

Figure 2C:
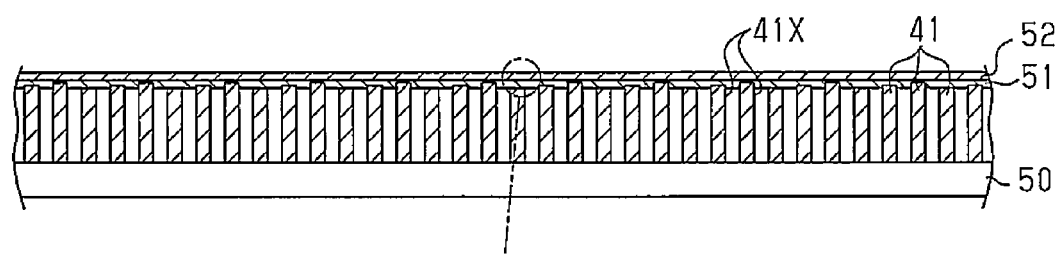
Figure 2D:
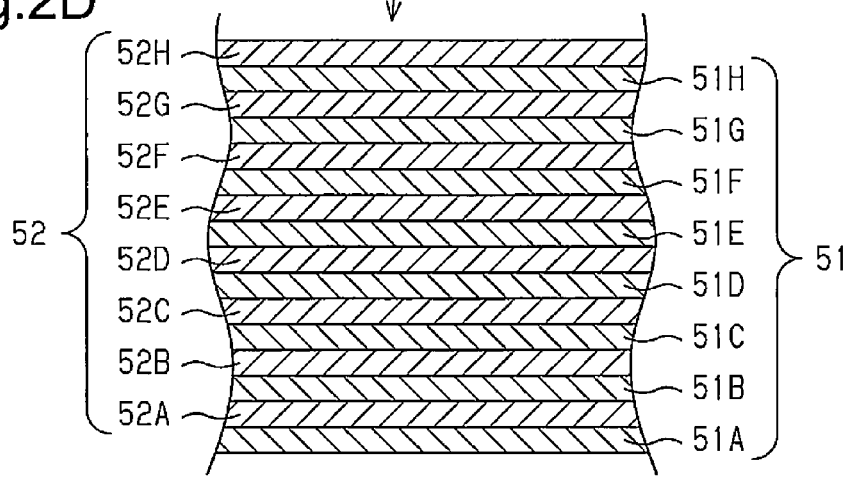
FIG. 2D is an enlarged cross-sectional view of a portion of the structure illustrated in FIG. 2C.

In the step illustrated in FIG. 2C, a metal layer 51 and a metal layer 52 are sequentially formed on the upper ends of the carbon nanotubes 41 to cover the upper ends of the carbon nanotubes 41. The metal layers 51 and 52 may be formed through, for example, sputtering or plating. The material of the metal layers 51 and 52 may be, for example, a metal having a self-heating property. For example, the material of the metal layer 51 may be aluminum (Al), and the material of the metal layer 52 may be palladium (Pd). The metal layers 51 and 52 are formed to enter, for example, through holes 41X extending between two adjacent carbon nanotubes 41. This covers the upper ends of the carbon nanotubes 41 with the metal layers 51 and 52. To facilitate illustration, in FIG. 2C, the metal layers 51 and 52 are each illustrated as a single layer. Actually, as illustrated in FIG. 2D, a plurality of (here, eight) Al films 51A to 51H and a plurality of (here, eight) Pd films 52A to 52H are alternately stacked. More specifically, the Al film 51A is formed on the upper ends of the carbon nanotubes 41. Then, the Pd film 52A, the Al film 51B, the Pd film 52B, the Al film 51C, the Pd film 52C, the Al film 51D, the Pd film 52D, the Al film 51E, the Pd film 52E, the Al film 51F, the Pd film 52F, the Al film 51G, the Pd film 52G, the Al film 51H, and the Pd film 52H are sequentially stacked on the Al film 51A. The Al films 51A to 51H and the Pd films 52A to 52H are thin films. Each of the Al films 51A to 51H has a thickness of, for example, approximately 20 to 30 nm. Each of the Pd films 52A to 52H has a thickness of, for example, approximately 20 to 30 nm. This step couples and integrates the carbon nanotubes 41 and the metal layers 51 and 52 in the sideward direction of the drawing (planar direction that is substantially parallel to upper surface of base material 50). In the following drawings, only the single metal layer 51 and the single metal layer 52 are illustrated in the same manner as FIG. 2C.

Figure 3A:
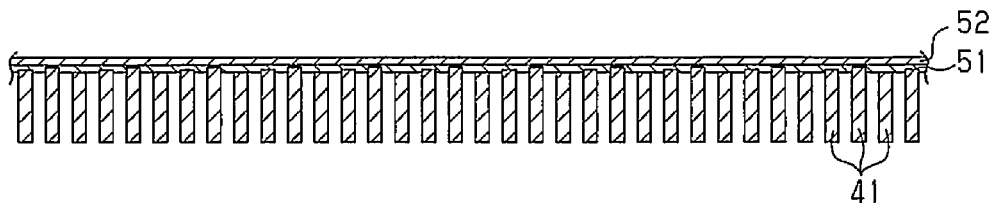
FIGS. 3A, 3B, and 3D are schematic cross-sectional views illustrating the procedures for manufacturing the heat conductor.

In the step illustrated in FIG. 3A, the carbon nanotubes 41 are mechanically removed from the base material 50 illustrated in FIG. 2C. The metal layers 51 and 52 are formed on the upper ends, and the lower ends of the carbon nanotubes 41 are exposed.

Figure 3B:
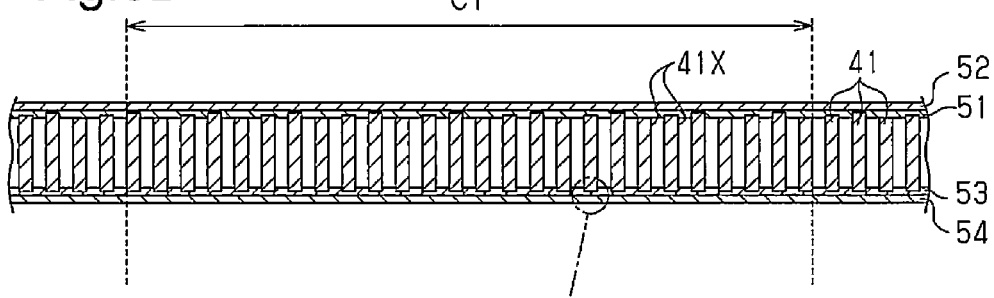
Figure 3C:
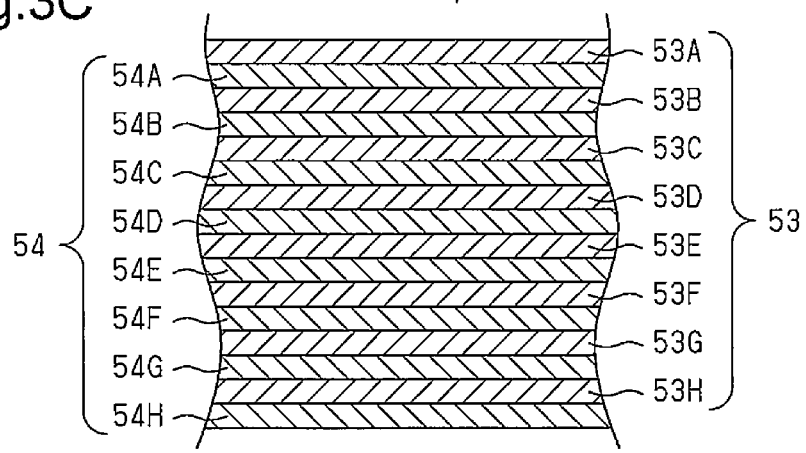
FIG. 3C is an enlarged cross-sectional view of a portion of the structure illustrated in FIG. 3B.

In the step illustrated in FIG. 3B, a metal layer 53 and a metal layer 54 are sequentially formed on the lower ends of the carbon nanotubes 41 to cover the lower ends of the carbon nanotubes 41. The metal layers 53 and 54 may be formed through, for example, sputtering or plating. The material of the metal layers 53 and 54 may be, for example, a metal having a self-heating property. For example, the material of the metal layer 53 may be palladium (Pd), and the material of the metal layer 54 may be aluminum (Al). The metal layers 53 and 54 are formed to enter, for example, the through holes 41X extending between two adjacent carbon nanotubes 41. This covers the lower ends of the carbon nanotubes 41 with the metal layers 53 and 54. To facilitate illustration, in FIG. 3B, the metal layers 53 and 54 are each illustrated as a single layer. Actually, as illustrated in FIG. 3C, a plurality of (here, eight) Pd films 53A to 53H and a plurality of (here, eight) Al films 54A to 54H are alternately stacked. More specifically, the Pd film 53A is formed on the lower ends of the carbon nanotubes 41. Then, the Al film 54A, the Pd film 53B, the Al film 54B, the Pd film 53C, the Al film 54C, the Pd film 53D, the Al film 54D, the Pd film 53E, the Al film 54E, the Pd film 53F, the Al film 54F, the Pd film 53G, the Al film 54G, the Pd film 53H, and the Al film 54H are sequentially stacked on the Pd film 53A. The Pd films 53A to 53H and the Al films 54A to 54H are thin films. Each of the Pd films 53A to 53H has a thickness of, for example, approximately 20 to 30 nm. Each of the Al films 54A to 54H has a thickness of, for example, approximately 20 to 30 nm. This step couples and integrates the carbon nanotubes 41 and the metal layers 53 and 54 in the sideward direction of the drawing. In the following drawings, only the single metal layer 53 and the single metal layer 54 are illustrated in the same manner as FIG. 3B.

Figure 3D:
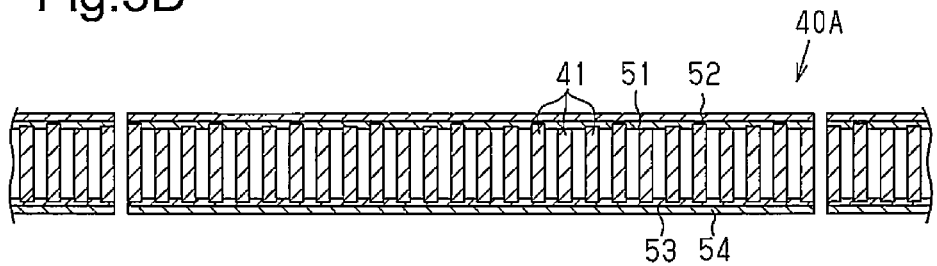

In the step illustrated in FIG. 3D, the structure illustrated in FIG. 3B is cut at positions illustrated by the broken lines. That is, the independent regions C1 are cut out from the structure illustrated in FIG. 3B. This obtains a plurality of heat conductors 40A. In each heat conductor 40A, the metal layers 51 and 52 are formed on the upper ends of the carbon nanotubes 41, and the metal layers 53 and 54 are formed on the lower ends of the carbon nanotubes 41.

Figure 4A:
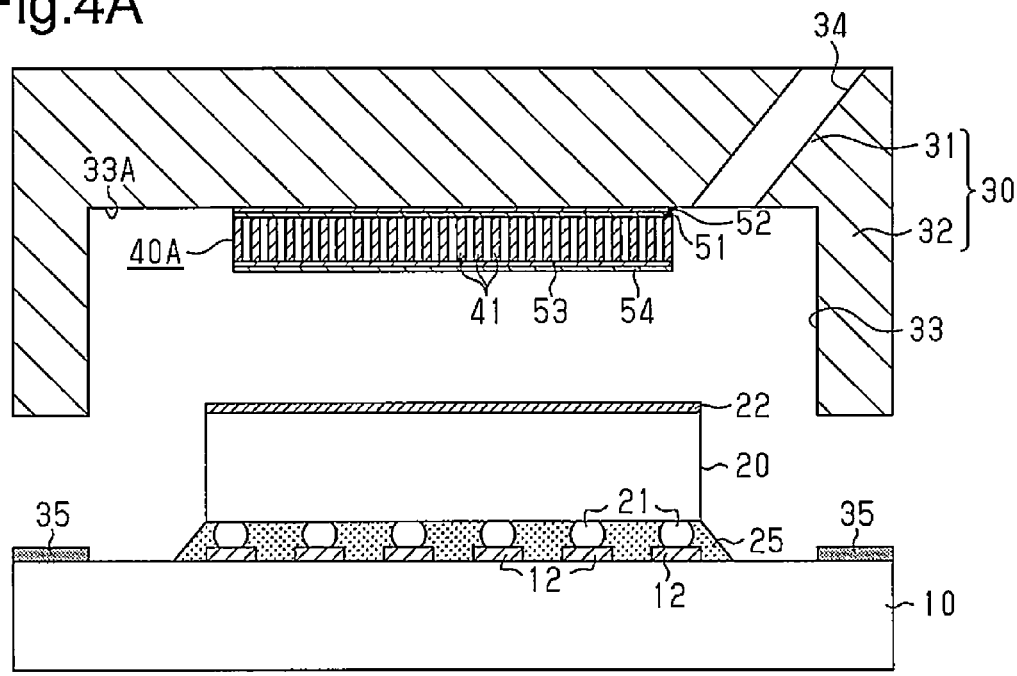
FIGS. 4A and 4B are schematic cross-sectional views illustrating the procedures for manufacturing a semiconductor device in one embodiment.

In the step illustrated in FIG. 4A, the heat dissipation plate 30, which includes the plate portion 31 and the frame-shaped side wall portion 32, is prepared. The heat dissipation plate 30 undergoes, for example, pressing or machining to form the cavity 33 and the through hole 34. The heat conductor 40A is placed on the inner surface 33A of the cavity 33. More specifically, the heat conductor 40A is placed on the inner surface 33A so that the metal layer 52 (Pd layer) contacts the heat dissipation plate 30 (Al layer).

In the step illustrated in FIG. 4A, the wiring substrate 10, on which the semiconductor element 20 is mounted, is prepared. Although not illustrated in the drawings, an example of a method for manufacturing the wiring substrate 10 will now be briefly described. The wiring substrate 10, which includes the connection pads 12, is formed, and the connection terminals 21 of the semiconductor element 20 are respectively flip-chip mounted on the connection pads 12. Then, the underfill resin 25 is formed between the wiring substrate 10 and the semiconductor element 20. Here, the metal film 22 is formed on the upper surface of the semiconductor element 20. The metal film 22 entirely covers the upper surface of the semiconductor element 20. The metal film 22 may be formed before or after the mounting of the semiconductor element 20. Further, the metal film 22 may be formed through, for example, sputtering or plating.

The adhesive 35 is applied in a frame-shaped manner to the upper surface of the wiring substrate 10 along the peripheral edge. Then, the heat dissipation plate 30, in which the heat conductor 40A is arranged, is placed on the wiring substrate 10 and the semiconductor element 20. More specifically, the heat dissipation plate 30 and the heat conductor 40A are arranged so that the bottom surface of the side wall portion 32 of the heat dissipation plate 30 opposes the adhesive 35 and so that the metal layer 54 (Al layer) of the heat conductor 40A faces the metal film 22 (Au layer).

Figure 4B:
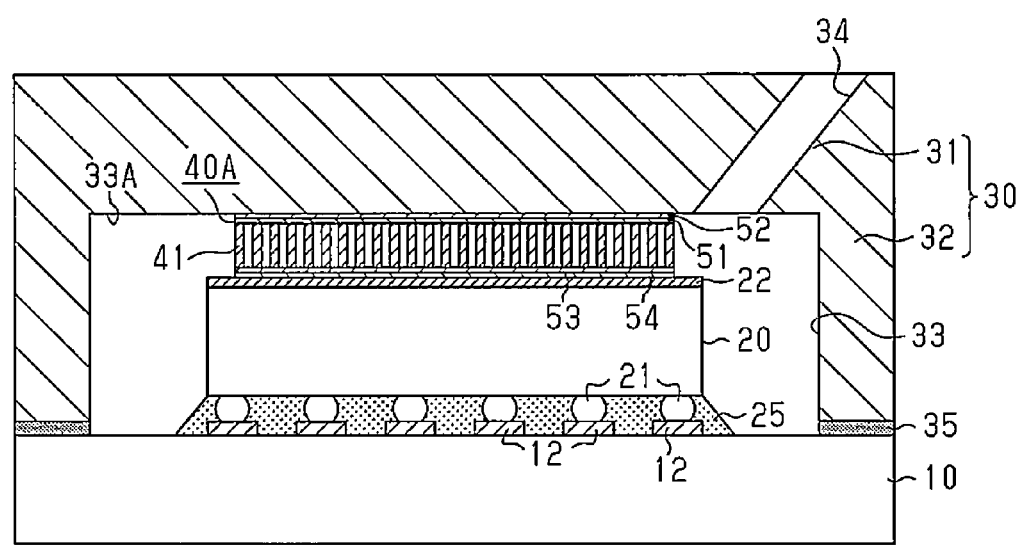

In the step illustrated in FIG. 4B, the bottom surface of the side wall portion 32 is forced against the adhesive 35, and the metal layer 54 is forced against the metal film 22. This attaches the heat dissipation plate 30 to the wiring substrate 10. That is, the heat dissipation plate 30 is mounted on the upper surface of the wiring substrate 10 with the heat conductor 40A located between the upper surface of the semiconductor element 20 and the inner surface 33A of the cavity 33. Here, in the heat conductor 40A, the upper surface of the metal layer 52 is only in physical contact with the inner surface 33A of the cavity 33 of the heat dissipation plate 30, and the lower surface of the metal layer 54 is only in physical contact with the upper surface of the metal film 22. The through hole 34 extends diagonally through the heat dissipation plate 30 toward the ends of the metal layers 53 and 54 from a location separated from the heat conductor 40A in a plan view.

Figure 5A:
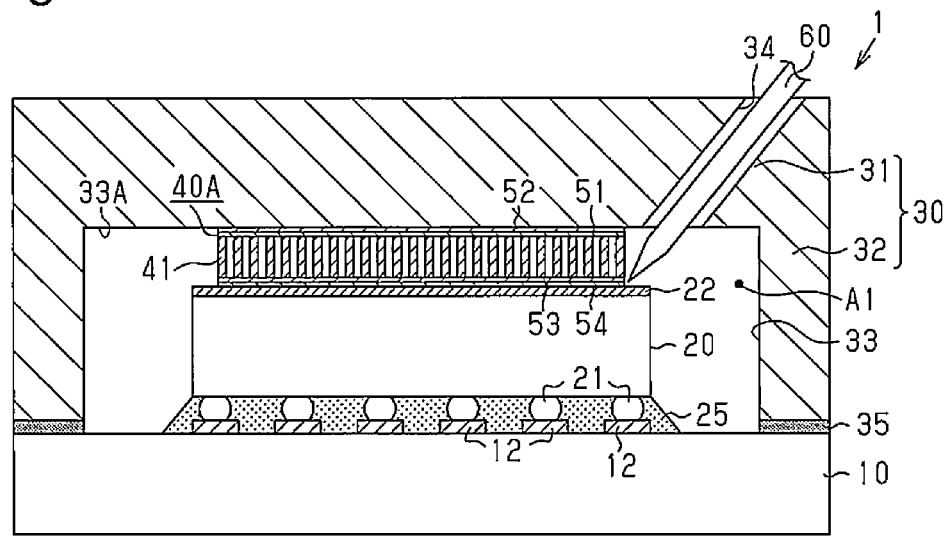
FIGS. 5A and 5B are schematic cross-sectional views illustrating the procedures for manufacturing the semiconductor device.
Figure 5B:
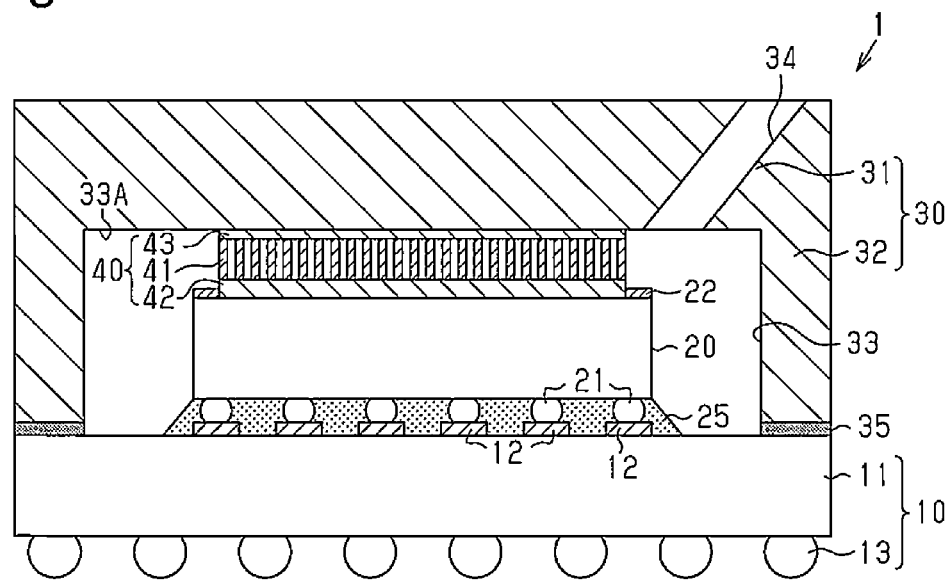

In the step illustrated in FIG. 5A, for example, a probe 60 is inserted through the through hole 34 of the heat dissipation plate 30 into the accommodation portion A1, which is defined by the cavity 33 and the wiring substrate 10. The distal end of the probe 60 is arranged near the ends of the metal layers 53 and 54 (boundary of metal layer 54 and metal film 22). Then, for example, a spark is generated at the ends of the metal layers 53 and 54 with the probe 60. The spark at the ends of the metal layers 53 and 54 starts synthesizing an alloy (e.g., intermetallic compound) of a metal element forming the metal layer 53 (here, Pd), a metal element forming the metal layer 54 (here, Al), and a metal element forming the metal film 22 (here, Au). When synthesizing a compound directly from these elements, a large amount of reaction heat is released, and the reaction heat raises the temperature to approximately 1500° C. to 3000° C. The reaction heat released during the synthesizing induces a chain reaction of chemical reactions between adjacent elements and synthesizes an alloy. Referring to FIG. 5B, this forms the alloy layer 42 with an alloy of Pd, Al, and Au between the carbon nanotubes 41 and the semiconductor element 20. The alloy layer 42 is bonded to the semiconductor element 20. The alloy layer 42 is formed by alloying the metal element forming the metal layer 53, the metal element forming the metal layer 54, and the metal element forming the metal film 22 that are illustrated in FIG. 5A. That is, the alloy layer 42 is formed by alloying the metal layers 53 and 54, which are portions of the heat conductor 40A, and the metal film 22, which is a portion of the semiconductor element 20. Thus, the formation of the alloy layer 42 metallically integrates the heat conductor 40 and the semiconductor element 20.

Further, the reaction heat released during the synthesizing is propagated in the thicknesswise direction. Thus, the reaction heat also produces a synthesizing reaction at the metal layers 51 and 52 and the heat dissipation plate 30, which are illustrated in FIG. 5A. More specifically, the propagation of reaction heat to the metal layers 51 and 52 starts synthesizing an alloy of a metal element forming the metal layer 51 (here, Al), a metal element forming the metal layer 52 (here, Pd), and a metal element forming the heat dissipation plate 30 (here, Al). This synthesizing reaction also releases a large amount of reaction heat, and the reaction heat raises the temperature to approximately 1500° C. to 3000° C. The reaction heat released during the synthesizing induces a chain reaction of chemical reactions between adjacent elements and synthesizes an alloy. Referring to FIG. 5B, this forms the alloy layer 43 with an alloy of Al and Pd between the carbon nanotubes 41 and the heat dissipation plate 30. The alloy layer 43 is bonded to the heat dissipation plate 30. The alloy layer 43 is formed by alloying the metal element forming the metal layer 51, the metal element forming the metal layer 52, and the metal element forming the heat dissipation plate 30 that are illustrated in FIG. 5A. That is, the alloy layer 43 is formed by alloying the metal layers 51 and 52, which are portions of the heat conductor 40A, and a portion in the surface of the heat dissipation plate 30. Thus, the formation of the alloy layer 43 metallically integrates the heat conductor 40 and the heat dissipation plate 30.

In this step, the spark at the ends of the metal layers 53 and 54 induces a self-heating reaction that spontaneously propagates a synthetic reaction and forms the alloy layers 42 and 43. This forms the heat conductor 40 between the semiconductor element 20 and the heat dissipation plate 30. In the present example, the metal layer 53 and the metal layer 54 form a structure that alternately stacks the thin Pd films 53A to 53H and the thin Al films 54A to 54H (refer to FIG. 3C). Further, the metal layer 51 and the metal layer 52 form a structure that alternately stacks the thin Al films 51A to 51H and the thin PD films 52A to 52H (refer to FIG. 2D). This increases the generated heat in comparison with when each of the metal layers 51 to 54 includes only a single layer and improves the propagation of the self-heating.

The self-heating reaction synthesizes an alloy within several tens of milliseconds, which is a short period of time. That is, the alloy layers 42 and 43 are formed within a short period of time. For example, during the self-heating reaction, the self-heating spontaneously propagates the synthesizing reaction to portions where reaction has not occurred, and the synthesizing is advanced by supplementing the induced energy required to synthesize a compound with the reaction heat of the self-heating. Thus, for example, there is no need to keep the structure of FIG. 5A in a furnace under a high temperature for a long time. Further, the self-heating reaction completes the formation of the alloy layers 42 and 43 under a high temperature of, for example, 1500° C. to 3000° C. This allows for the formation of the alloy layers 42 and 43 that have a high melting point.

Then, the solder balls 13 are formed to manufacture the semiconductor device 1 illustrated in FIG. 1.

The present embodiment has the advantages described below.

(1) The metal layers 53 and 54 are formed covering the lower ends of the carbon nanotubes, and a self-heating reaction is used to alloy the metal layers 53 and 54 with the metal film 22, which forms a portion of the semiconductor element 20, to form the alloy layer 43. This metallically integrates the alloy layer 42 and the semiconductor element 20 and metallically integrates the alloy layer 43 and the heat dissipation plate 30. Accordingly, the thermal heat resistance may be decreased between the semiconductor element 20 and the heat conductor 40, and the thermal heat resistance may be decreased between the heat dissipation plate 30 and the heat conductor 40. This allows the heat generated by the semiconductor element 20 to be efficiently transferred via the heat conductor 40 to the heat dissipation plate 30. Consequently, the heat dissipation of the semiconductor device 1 may be improved.

(2) The through hole 34 extends through the heat dissipation plate 30 toward the end of the heat conductor 40A (metal layers 53 and 54) from a position separated from the heat conductor 40A in a plan view. Thus, the probe 60, which is inserted into the accommodation portion A1 from the through hole 34, may be arranged near the end of the heat conductor 40. The probe 60 generates a spark at the end of the heat conductor 40. In other words, a spark is generated only at the desired location and limited at other locations, such as a corner of the semiconductor element 20.

(3) The probe 60 inserted through the through hole 34 is used to induce a self-heating reaction at the end of the heat conductor 40 and form the alloy layers 42 and 43. This allows for the formation of the alloy layers 42 and 43 within several tens of milliseconds, which is a short period of time. Further, the alloy layers 42 and 43 may be formed without the need to keep a structure obtained in a manufacturing step (e.g., the structure of FIG. 5A) in a furnace under a high temperature for a long time.

(4) Further, the alloy layers 42 and 43 may be formed with a high melting point. Thus, even when performing a heat process such as a reflow process after forming the alloy layers 42 and 43, the melting of the alloy layers 42 and 43 is limited. Further, breakage or the like between the carbon nanotubes 41 and the alloy layers 42 and 43 is limited.

(5) The metal layers 51 and 52 are formed by alternately stacking the thin Al films 51A to 51H and the thin Pd films 52A to 52H (refer to FIG. 2D). The metal layers 53 and 54 are formed by alternately stacking the thin Pd films 53A to 53H and the thin Al films 54A to 54H (refer to FIG. 3C). This increases the generated heat in comparison with when forming each of the metal layers 51 to 54 with a single layer and improves the propagation of the self-heating.

(6) The heat conductor 40 is formed so that the lower ends of the carbon nanotubes 41 are bonded to the alloy layer 42 and the upper ends of the carbon nanotubes 41 are bonded to the alloy layer 43. The alloy layer 42 is bonded to the semiconductor element 20, and the alloy layer 43 is bonded to the heat dissipation plate 30. This allows the carbon nanotubes 41 to be arranged in the direction heat is transferred and improves heat conduction. Further, there is no need to use indium, which is expensive, or the like. Thus, the cost of the heat conductor 40 may be reduced.

It should be apparent to those skilled in the art that the present disclosure may be embodied in many other specific forms without departing from the spirit or scope of the disclosure. Particularly, it should be understood that the present disclosure may be embodied in the following forms.

In the above embodiment, the alloy layer 42 is formed on the upper surface of the semiconductor element 20. Instead, the metal film 22 may be arranged between the alloy layer 42 and the semiconductor element 20. In other words, the alloy layer 42 may be formed on the metal film 22. In this case, for example, the metal film 22 located immediately below the alloy layer 42 is thinner than the metal film 22 covering the outer side surfaces of the alloy layer 42. In this case, the alloy layer 42 is formed by alloying the metal layers 53 and 54 with a portion of the metal film 22 that contacts the metal layer 54 in the thicknesswise direction. For example, by increasing the thickness of the metal film 22 prior to the formation of the alloy layer 42, the metal film 22 may be arranged between the alloy layer 42 and the semiconductor element 20.

The metal film 22 of the above embodiment may be a structure stacking multiple types of metal films. For example, a Ti film formed from titanium (Ti), a Pt film formed from platinum (Pt), and an Au film formed from gold (Au) may be sequentially stacked to form the metal film 22. In this case, the alloy layer 42 may be formed from portions of the Ti film, the Pt film, and the Au film. For example, the alloy layer 42 may be formed by alloying the metal elements forming the metal layers 53 and 54, the metal element (Au) forming the Au film, and the metal element (Pt) forming the Pt film. In this case, at least the Ti film is arranged between the alloy layer 42 and the semiconductor element 20.

The metal film 22 of the above embodiment may be omitted. In this case, the alloy layer 42 is formed from an alloy including the metal element forming the metal layer 53, the metal element forming the metal layer 54, and the metal element (e.g., silicon) forming the semiconductor element 20.

In the above embodiment, the heat conductor 40 may be formed so that the heat conductor 40 entirely covers the upper surface of the semiconductor element 20. In this case, the metal film 22 that covers the outer side surfaces of the alloy layer 42 is eliminated.

In the above embodiment, a metal film may be formed on the surface of the heat dissipation plate 30 at least at a portion that comes into contact with the heat conductor 40A. The metal film may be a single-layer metal film or have a structure stacking multiple types of metal films. The material of the metal film may be, for example, nickel, titanium, gold, or platinum. The metal film may be formed through, for example, sputtering or plating.

The material of the metal layers 51 to 54 in the above embodiment is not particularly limited as long as it is a metal having a self-heating property. For example, the material of the metal layers 51 and 54 may be aluminum, and the material of the metal layers 52 and 53 may be nickel.

In the above embodiment, when the lower surface of the metal layer 54 is in contact with the upper surface of the metal film 22 and the upper surface of the metal layer 52 is in contact with the inner surface 33A of the cavity 33, the heat dissipation plate 30 is mounted on the wiring substrate 10. Instead, the heat conductor 40A may be arranged upside-down. When the upside-down heat conductor 40A is arranged between the heat dissipation plate 30 and the semiconductor element 20, the heat dissipation plate 30 may be mounted on the wiring substrate 10. That is, when the upper surface of the metal layer 52 is in contact with the upper surface of the metal film 22 and the lower surface of the metal layer 54 is in contact with the inner surface 33A of the cavity 33, the heat dissipation plate 30 may be mounted on the wiring substrate 10. In this case, for example, there will be a predetermined difference in the position of the ends of carbon nanotubes 41 located at the side of the semiconductor element 20.

In the above embodiment, the through hole 34 is formed in the plate portion of the heat dissipation plate 30. Instead, for example, the through hole 34 may be formed in the side wall portion of the heat dissipation plate 30.

In the above embodiment, the through hole 34 may be filled with a metal material or a resin material. In this case, for example, the through hole 34 is filled with the metal material or the resin material after forming the alloy layers 42 and 43. It is preferred that the through hole 34 be filled with a material having a favorable heat conductivity.

In the above embodiment, a spark is generated only at an end of the metal layers 53 and 54. Instead, for example, a spark may be generated at the end of the metal layers 53 and 54 and a further spark may be generated at the end of the metal layers 51 and 52.

In the above embodiment, a spark is generated at the ends of the metal layers 53 and 54 to induce a self-heating reaction. Instead, for example, a self-heating reaction may be induced by emission of a laser beam or supply of an overcurrent.

Figure 6:
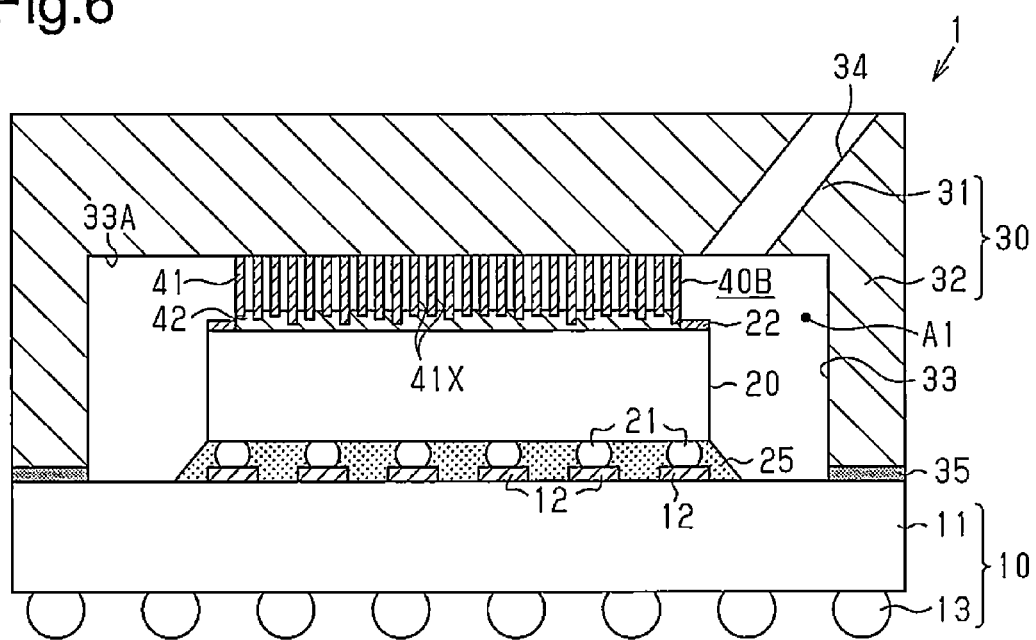
FIG. 6 is a schematic cross-section view illustrating a modified example of the semiconductor device.

Referring to FIG. 6, instead of the heat conductor 40, a heat conductor 40B may be arranged between the semiconductor element 20 and the heat dissipation plate 30. The heat conductor 40B includes the carbon nanotubes 41 and the alloy layer 42. More specifically, the heat conductor 40B has a structure in which the alloy layer 43 is omitted from the heat conductor 40 illustrated in FIG. 1.

The carbon nanotubes 41 are formed projecting from the inner surface 33A of the cavity 33 of the heat dissipation plate 30. The carbon nanotubes 41 are formed by performing CVD or the like on the heat dissipation plate 30 after forming a metal catalyst layer on the inner surface 33A. There is, for example, a predetermined difference in the position where the lower ends of the carbon nanotubes 41 are located. The relative difference between the positions where the shortest carbon nanotube 41 and the longest carbon nanotube 41 are located is, for example, approximately 2 μm.

The alloy layer 42 is bonded to the carbon nanotubes 41 and the semiconductor element 20. The alloy layer 42 covers, for example, the lower ends of the carbon nanotubes 41. The alloy layer 42 integrates and couples the carbon nanotubes 41 in the sideward direction as viewed in the drawing (planar direction that is substantially parallel to upper surface of semiconductor element 20). To absorb, for example, differences in the lengths of the carbon nanotubes 41, it is preferred that the alloy layer 42 have a greater thickness than the relative difference between the position where the upper end of the shortest carbon nanotube 41 is located and the position where the upper end of the longest carbon nanotube 41 is located. The alloy layer 42 may have a thickness of, for example, 2 to 5 µm.

In the same manner as the above embodiment, the alloy layer 42 is a metal layer formed by alloying the metal element (here, Au) forming the metal film 22, which is a portion of the semiconductor element 20. The alloy layer 42 is metallically integrated with the semiconductor element 20.

When employing such a structure, the contact thermal resistance may be decreased between the semiconductor element 20 and the heat conductor 40B. Thus, the heat generated by the semiconductor element 20 may be efficiently transferred to the heat dissipation plate 30 through the heat conductor 40B. This improves the heat dissipation of the semiconductor device 1.

In the heat conductors 40 and 40B of the above embodiment and the above modified example, the through holes 41X formed between adjacent carbon nanotubes 41 may be filled with a resin.

The number of the semiconductor elements 20 mounted on the wiring substrate 10 in the above embodiment is not particularly limited. For example, two or more semiconductor elements 20 may be mounted on the wiring substrate. Further, an electronic component outer than the semiconductor element 20 may be mounted on the wiring substrate 10.

The above embodiment is applied to the BGA wiring substrate but may be applied instead to, for example, a pin grid array (PGA) wiring substrate or a land grid array (LGA) wiring substrate.

Cooling and heat dissipation means, such as heat dissipation fins, a heat pipe, and a vapor chamber may be arranged above the heat dissipation plate of the above embodiment. In this case, the heat conductor 40 may be arranged between the heat dissipation plate 30 and the cooling and heat dissipation means or between different cooling and heat dissipation means.

Clauses

This disclosure further encompasses various embodiments described below.

1. A method for manufacturing a semiconductor device, the method including:
  forming a heat conductor, wherein the forming a heat conductor includes:
    preparing a base material;
    forming linear heat conductive matters on an upper surface of the base material;
    alternately stacking first metal films and second metal films on upper ends of the heat conductive matters, wherein the first metal films are formed by a first metal element having a self-heating property, the second metal films are formed by a second metal element having a self-heating property, and the second metal element differs from the first metal element,
    removing the base material from the heat conductive matters to expose lower ends of the heat conductive matters; and
    alternately stacking third metal films and fourth metal films on lower ends of the heat conductive matters, wherein the third metal films are formed by a third metal element having a self-heating property, the fourth metal films are formed by a fourth metal element having a self-heating property, and the fourth metal element differs from the third metal element;
  preparing a wiring substrate, on which a semiconductor element is mounted, and a heat dissipation component, which includes a cavity and a through hole;
  mounting the heat dissipation component on an upper surface of the wiring substrate with the heat conductor arranged between an upper surface of the semiconductor element and an inner surface of the cavity; and
  forming a first alloy layer bonded to the heat conductive matters and the semiconductor element and a second alloy layer bonded to the heat conductive matters and the heat dissipation component by inserting a tool through the through hole to an end of the heat conductor and inducing, at the end, a self-heating reaction in the first metal films, the second metal films, the third metal films, and the fourth metal films.

2. The method according to clause 1, wherein:
  the mounting the heat dissipation component includes arranging the heat conductor so that one of the fourth metal films contacts the upper surface of the semiconductor element and one of the second metal films contacts an inner surface of the cavity;
  the first alloy layer covers lower ends of the heat conductive matters, wherein the first alloy layer is formed by an alloy including the third metal element, the fourth metal element, and an element forming the semiconductor element; and
  the second alloy layer covers upper ends of the heat conductive matters, wherein the second alloy layer is formed by an alloy including the first metal element, the second metal element, and an element forming the heat dissipation component.

3. The method according to clause 1, wherein:
  the preparing a wiring substrate includes forming a fifth metal film on the upper surface of the semiconductor element;
  the mounting the heat dissipation component includes arranging the heat conductor so that one of the fourth metal films contacts an upper surface of the fifth metal film; and
  the first alloy layer covers the lower ends of the heat conductive matters, and the first alloy layer is formed by an alloy including the third metal element, the fourth metal element, and a fifth metal element forming the fifth metal film.

The present examples and embodiments are to be considered as illustrative and not restrictive, and the disclosure is not to be limited to the details given herein, but may be modified within the scope and equivalence of the appended claims.

The invention claimed is:
1. A semiconductor device comprising:
  a wiring substrate;
  a semiconductor element mounted on an upper surface of the wiring substrate;
  a heat dissipation component arranged on the upper surface of the wiring substrate, wherein the heat dissipation component includes a cavity that accommodates the semiconductor element and includes an inner surface opposing the upper surface of the wiring substrate, and the semiconductor element is located between the inner surface of the cavity and the upper surface of the wiring substrate; and a heat conductor bonded to an upper surface of the semiconductor element and to the inner surface of the cavity, wherein:
the heat conductor includes:
  linear heat conductive matters arranged between the semiconductor element and the heat dissipation component, and
  a first alloy layer bonded to the upper surface of the semiconductor element, wherein the first alloy layer covers lower ends of the heat conductive matters; and
the heat dissipation component includes a through hole extending through the heat dissipation component toward the heat conductor from a location outside of the heat conductor in a plan view.
wherein:
the semiconductor element includes a metal film formed on the upper surface of the semiconductor element; and
the first alloy layer is formed by an alloy including a metal element that forms the metal film.

2. The semiconductor device according to claim 1, wherein the first alloy layer is formed by an alloy including an element that forms the semiconductor element.

3. The semiconductor device according to claim 1, wherein:
  the heat conductor includes a second alloy layer bonded to the inner surface of the cavity;
  the second alloy layer covers upper ends of the heat conductive matters; and
  the second alloy layer is formed by an alloy including an element forming the heat dissipation component.

4. The semiconductor device according to claim 1, wherein the heat conductive matters are carbon nanotubes.

* * * * *